(12) United States Patent
Lu et al.

(10) Patent No.: US 9,568,301 B2
(45) Date of Patent: Feb. 14, 2017

(54) SYSTEMS AND METHODS FOR CAPACITIVE PROXIMITY SENSING

(71) Applicant: General Electric Company, Schenectady, NY (US)

(72) Inventors: Dan Tho Lu, Minden, NV (US); Lam Arthur Campbell, Tomball, TX (US)

(73) Assignee: General Electric Company, Schenectady, NY (US)

( * ) Notice: Subject to any disclaimer, the term of this patent is extended or adjusted under 35 U.S.C. 154(b) by 383 days.

(21) Appl. No.: 14/251,237

(22) Filed: Apr. 11, 2014

(65) Prior Publication Data

US 2015/0292857 A1 Oct. 15, 2015

(51) Int. Cl.

| | |
|---|---|
| *G01B 7/30* | (2006.01) |
| *G01R 29/08* | (2006.01) |
| *G01R 1/04* | (2006.01) |
| *G01H 1/00* | (2006.01) |
| *G01H 11/06* | (2006.01) |

(52) U.S. Cl.
CPC ............... *G01B 7/30* (2013.01); *G01H 1/003* (2013.01); *G01H 11/06* (2013.01); *G01R 1/04* (2013.01); *G01R 29/08* (2013.01)

(58) Field of Classification Search
None
See application file for complete search history.

(56) References Cited

U.S. PATENT DOCUMENTS

| 3,961,318 | A | * | 6/1976 | Farrand | G01B 7/30 |
|---|---|---|---|---|---|
| | | | | | 318/662 |
| 4,636,792 | A | * | 1/1987 | Watson | G01D 5/2412 |
| | | | | | 33/1 PT |
| 4,769,594 | A | * | 9/1988 | Darius | G01H 11/06 |
| | | | | | 324/662 |
| 4,955,269 | A | * | 9/1990 | Kendig | G07C 3/00 |
| | | | | | 73/114.07 |
| 4,996,880 | A | * | 3/1991 | Leon | G01H 1/006 |
| | | | | | 73/112.06 |
| 5,023,749 | A | * | 6/1991 | Hubert | G01B 7/30 |
| | | | | | 361/292 |
| 5,068,653 | A | * | 11/1991 | Klingler | G01B 7/02 |
| | | | | | 324/161 |

(Continued)

OTHER PUBLICATIONS

Invitation to Pay Additional Fees issued in connection with corresponding PCT Application No. PCT/US2015/023455 dated Aug. 4, 2015.

*Primary Examiner* — Jermele M Hollington
*Assistant Examiner* — Suresh K Rajaputra
(74) *Attorney, Agent, or Firm* — Fletcher Yoder P.C.

(57) ABSTRACT

A system includes first, second, third and fourth capacitive sensors, each disposed about a longitudinal axis. The first capacitive sensor is disposed along a first axis radial to the longitudinal axis, and the third capacitive sensor is disposed along the first axis opposite the first capacitive sensor. The second capacitive sensor is disposed along a second axis radial to the longitudinal axis, the fourth capacitive sensor is disposed along the second axis opposite the second capacitive sensor, and the second axis is different from the first axis. Each capacitive sensor is configured to transmit a respective signal based at least in part on a position of a rotational component along the respective axis relative to the longitudinal axis.

20 Claims, 3 Drawing Sheets

(56) References Cited

U.S. PATENT DOCUMENTS

| | | | | |
|---|---|---|---|---|
| 5,566,572 A * | 10/1996 | Pankow | ............... | G01F 23/266 324/611 |
| 5,598,153 A * | 1/1997 | Brasseur | ............... | G01B 7/30 318/662 |
| 5,657,006 A * | 8/1997 | Kinoshita | ............... | G01B 7/30 324/660 |
| 6,118,283 A * | 9/2000 | Cripe | ............... | G01B 7/30 324/660 |
| 6,346,807 B1 * | 2/2002 | Slates | ............... | G01B 7/003 324/207.11 |
| 6,433,559 B1 * | 8/2002 | Lahoreau | ............... | B62D 15/02 324/658 |
| 6,449,853 B1 * | 9/2002 | Brueggemann | ............... | G01D 5/2412 33/1 N |
| 6,483,321 B2 * | 11/2002 | Brasseur | ............... | G01D 5/2412 324/660 |
| 7,019,538 B2 * | 3/2006 | Kitaoka | ............... | G01B 7/287 324/658 |
| 7,075,317 B2 * | 7/2006 | Berting | ............... | G01D 5/2415 324/662 |
| 7,084,643 B2 * | 8/2006 | Howard | ............... | G01B 7/14 324/663 |
| 7,135,874 B2 * | 11/2006 | Berting | ............... | G01N 11/14 324/662 |
| 7,256,588 B2 * | 8/2007 | Howard | ............... | G01B 7/14 324/658 |
| 7,554,324 B2 * | 6/2009 | Gualtieri | ............... | F01D 17/02 324/207.16 |
| 8,281,655 B2 * | 10/2012 | Bahorich | ............... | G01F 23/268 73/304 C |
| 8,344,741 B2 * | 1/2013 | Sheikman | ............... | G01B 7/14 324/658 |
| 8,365,574 B2 * | 2/2013 | Schmidt | ............... | G01D 5/24 324/601 |
| 8,970,228 B2 * | 3/2015 | Andarawis | ............... | G01B 7/14 324/658 |
| 9,322,674 B2 * | 4/2016 | Rassomagin | ............... | G01D 5/2412 |
| 9,341,462 B2 * | 5/2016 | Szedlacsek | ............... | G01B 7/14 |
| 2003/0210039 A1 * | 11/2003 | Slates | ............... | G01B 7/003 324/207.16 |
| 2007/0005294 A1 * | 1/2007 | Andarawis | ............... | G01B 7/144 702/155 |
| 2011/0175629 A1 * | 7/2011 | Duden | ............... | G01B 7/003 324/658 |
| 2012/0296593 A1 * | 11/2012 | Seccombe | ............... | F01D 11/14 702/94 |
| 2013/0010285 A1 * | 1/2013 | Wakai | ............... | G01B 7/003 356/72 |
| 2013/0167661 A1 * | 7/2013 | Nishioki | ............... | G01L 3/106 73/862.337 |
| 2013/0321000 A1 * | 12/2013 | Andarawis | ............... | G01B 7/14 324/658 |
| 2014/0090492 A1 * | 4/2014 | Warren | ............... | F01D 11/20 73/866.5 |
| 2014/0375340 A1 * | 12/2014 | Mohamed Zuhair | ............... | G01B 7/30 324/684 |

* cited by examiner

SYSTEMS AND METHODS FOR CAPACITIVE PROXIMITY SENSING

BACKGROUND

The subject matter disclosed herein relates to systems and methods for capacitive proximity sensing, and in particular, to systems and methods for capacitive proximity sensing of rotational components.

Rotary equipment, such as turbomachinery, has one or more rotating components, such as a shaft, a rotor, an impeller, compressor blades, turbine blades, or wheels. Each of the one or more rotating components may rotate about a centerline, and the centerlines of rotating components may not be mutually coaxial or parallel. Furthermore, rotating components may be arranged within compact enclosures having limited available space for equipment to monitor the rotating components. Unfortunately, magnetic fields near rotating components may complicate the use of monitoring equipment and/or limit the effectiveness of the monitoring equipment.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a first capacitive sensor, a second capacitive sensor, a third capacitive sensor, and a fourth capacitive sensor. The first capacitive sensor is disposed about a longitudinal axis and along a first axis radial to the longitudinal axis. The first capacitive sensor is configured to transmit a first signal based at least in part on a first position of a rotational component along the first axis relative to the longitudinal axis. The second capacitive sensor is disposed about the longitudinal axis and along a second axis radial to the longitudinal axis, where the second axis is different from the first axis. The second capacitive sensor is configured to transmit a second signal based at least in part on a second position of the rotational component along the second axis relative to the longitudinal axis. The third capacitive sensor is disposed about the longitudinal axis and along the first axis opposite to the first capacitive sensor, wherein the third capacitive sensor is configured to transmit a third signal based at least in part on a third position of the rotational component along the first axis. The fourth capacitive sensor is disposed about the longitudinal axis and along the second axis opposite to the second capacitive sensor, wherein the fourth capacitive sensor is configured to transmit a fourth signal based at least in part on a fourth position of the rotational component along the second axis.

In a second embodiment, a system includes a shaft configured to rotate about a longitudinal axis and a first sensor assembly disposed about the longitudinal axis at a first axial position. The shaft includes a shaft axis. The first sensor assembly includes a first capacitive sensor having a first face disposed a first distance from the shaft along a first axis. The first capacitive sensor is configured to transmit a first signal based at least in part on the first distance. The first sensor assembly includes a second capacitive sensor having a second face disposed a second distance from the shaft along a second axis that is perpendicular to the first axis. The second capacitive sensor is configured to transmit a second signal based at least in part on the second distance. The first sensor assembly includes a third capacitive sensor having a third face disposed a third distance from the shaft along the first axis opposite the first capacitive sensor. The third capacitive sensor is configured to transmit a third signal based at least in part on the third distance. The first sensor assembly includes a fourth capacitive sensor having a fourth face disposed a fourth distance from the shaft along the second axis opposite the second capacitive sensor. The fourth capacitive sensor is configured to transmit a fourth signal based at least in part on the fourth distance. The first sensor assembly includes a controller configured to determine a first parameter of the system at the first axial position based at least in part on the first signal, the second signal, the third signal, and the fourth signal, where the first parameter includes a first location of the shaft relative to the longitudinal axis at the first axial position, a first vibration of the shaft about the longitudinal axis, or any combination thereof.

In a third embodiment, a method includes transmitting a first signal from a first capacitive sensor to a controller based at least in part on a first distance between the first capacitive sensor and a rotational component, transmitting a second signal from a second capacitive sensor to the controller based at least in part on a second distance between the second capacitive sensor and the rotational component, transmitting a third signal from a third capacitive sensor to the controller based at least in part on a third distance between the third capacitive sensor and the rotational component, transmitting a fourth signal from a fourth capacitive sensor to the controller based at least in part on a fourth distance between the fourth capacitive sensor and the rotational component, and determining a parameter of a rotational system comprising the rotational component based at least in part on the first signal and the second signal. The first capacitive sensor is disposed along a first axis radial to the longitudinal axis, the second capacitive sensor is disposed along a second axis radial to the longitudinal axis and perpendicular to the first axis, the third capacitive sensor is disposed along the first axis opposite the first capacitive sensor, and the fourth capacitive sensor is disposed along the second axis opposite the second capacitive sensor. The parameter includes a first location of the rotational component relative to the longitudinal axis, a first vibration of the rotational component about the longitudinal axis, a characteristic of a fluid disposed about the rotational component, or any combination thereof.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
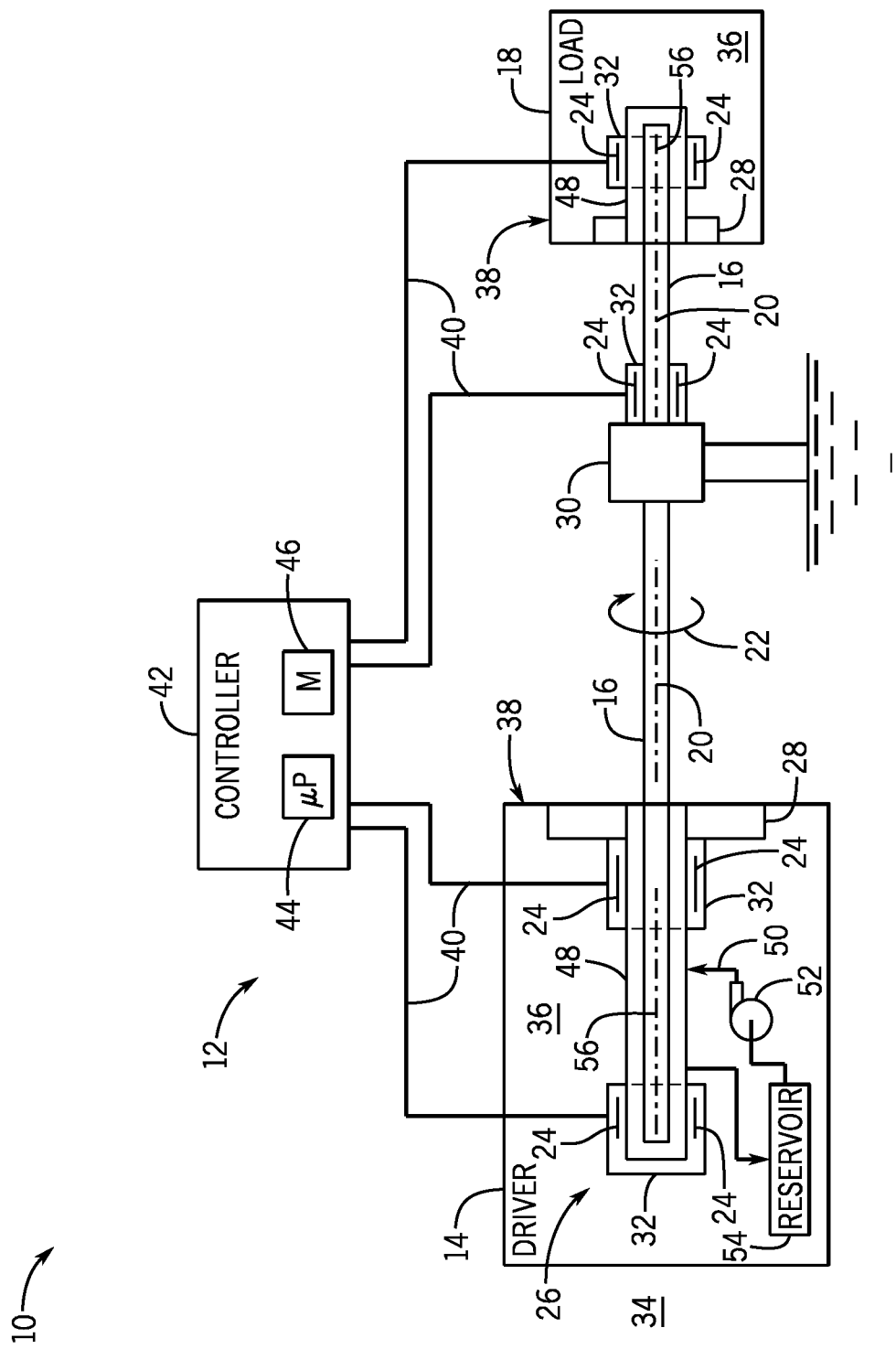
FIG. 1 is a schematic diagram illustrating an embodiment of a monitoring system, in accordance with aspects of the present disclosure.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Capacitive sensors of a monitoring system provide feedback to a controller (e.g., a processor-based industrial controller) to determine operational parameters (e.g., position, movement, vibration) of rotational components and/or characteristics of fluids disposed about rotational components. For example, the rotational components may include shafts of a motor, pump, wheel, generator, turbine, compressor, or various turbomachinery, and fluids disposed about rotational components may include lubricants, coolants, or any combination thereof. The controller may monitor a distance between each of the capacitive sensors of the monitoring system and the rotational component. Each capacitive sensor may transmit a signal to the controller based at least in part on a voltage between the respective capacitive sensor and the rotational component. For each capacitive sensor, the controller may determine the distance between the respective capacitive sensor and the rotational component based at least in part on a functional relationship between the transmitted signal and the distance. Each capacitive sensor is aligned along an axis, thereby enabling the controller to determine the position of the rotational component along the axis relative to the respective capacitive sensor. Utilizing multiple capacitive sensors aligned along different radial axes, the controller may determine one or more operational parameters (e.g., position, movement, vibration) of a rotational component relative to a longitudinal axis. The capacitive sensors may be arranged in a predefined orientation and spacing relative to the longitudinal axis.

The controller may determine the position, movement, and/or vibration of the rotational component relative to the longitudinal axis utilizing various arrangements of the capacitive sensors about the rotational component. For example, a first set of two or more capacitive sensors may be arranged within the same plane, such that the respective radial axes through the capacitive sensors are perpendicular to each other through the longitudinal axis. The perpendicular arrangement of the first set of capacitive sensors enables the controller to determine the position of the rotational component relative to the longitudinal axis along independent radial axes (e.g., X-axis, Y-axis). An additional second set of capacitive sensors arranged opposite to the first set of capacitive sensors enables the controller to readily factor out common mode noise, the permittivity of materials in the spaces between each capacitive sensor and the rotational component, or any combination thereof. As discussed in detail below, two or more capacitive sensors may be arranged about the rotational component in various configurations. In some embodiments, two or more capacitive sensors may be arranged circumferentially about a longitudinal axis at approximately equal angular positions, such as every 10, 20, 30, 45, 60, 90, or 180 degrees.

The capacitive sensors may be arranged separately about the rotational component, or within a common capacitive sensor housing. The capacitive sensors may be arranged about the rotational component near and/or adjacent to a bearing assembly or a drive assembly. In some embodiments, capacitive sensors may be arranged within a bearing or drive assembly. Furthermore, a rotational system may include multiple capacitive sensor housings, each capacitive sensor housing having capacitive sensors arranged in a configuration discussed below. The capacitive sensor housing may be disposed with a rotational system within an enclosure. For example, the capacitive sensor housing may be disposed within a motor, pump, or generator enclosure. In some embodiments, the capacitive sensor housing is mounted about a rotational component along a longitudinal axis of the rotational component (e.g., shaft). In some embodiments, the capacitive sensor housing and/or the enclosure may be subject to various pressure environments including, but not limited to, high altitude environments (e.g., 11 kPa), sea level environments (e.g., 101 kPa), and subsea environments (e.g., 103 MPa), or any combination thereof. As discussed in detail below, the shape, area, and arrangement of each of the capacitive sensors about the rotational component may affect the determination of operational parameters (e.g., position, movement, vibration) of the rotational component.

Turning to the drawings, FIG. 1 is a schematic diagram that illustrates an embodiment of a rotational system 10 (e.g., rotary machinery such as turbomachinery) and a rotational monitoring system 12. In the rotational system 10, a driver 14 rotates a shaft 16 coupled to one or more loads 18. The driver 14 may include, but is not limited to, a gas turbine, a steam turbine, a wind turbine, a hydro turbine, a reciprocating engine (e.g., diesel, gasoline, pneumatic), an electric motor, a hydraulic motor, a pneumatic motor, or any combination thereof. The driver 14 provides a rotational output via the shaft 16 to the one or more loads 18, each of which may include, but is not limited to, a vehicle or a stationary load. In some embodiments, the one or more loads 18 may include a propeller on an aircraft, an electrical generator in a power plant, a compressor, a pump, a fan, a machine, any suitable device capable of being powered by the rotational output of the driver 14, or any combination thereof. The shaft 16 rotates along an axis 20. In some embodiments, the rotational system 10 includes multiple shafts coupled to one another. Each shaft 16 rotates along a respective axis 20 as shown by arrow 22.

The monitoring system 12 monitors the rotational system 10 and determines one or more operational parameters of rotational components (e.g., driver 14, shaft 16, load 18) of the rotational system 10. Operational parameters may include position, movement, or vibration, or any combination thereof. One or more capacitive sensors 24 arranged along the rotational system 10 are spaced apart from a rotational component (e.g., shaft 16) at one or more axial locations of the rotational system 10. For example, the capacitive sensors 24 may be arranged at an end 26 of the shaft 16, about the shaft 16 adjacent to a bearing assembly 28 or gearbox 30, or about the shaft 16 separate from a bearing assembly 28 or gearbox 30, or any combination thereof. As discussed in detail below, multiple (e.g., 2, 3, 4, 5, 6, 7, 8, 9, 10, or more) capacitive sensors 24 at each axial location may be disposed in a capacitive sensor housing 32. Multiple capacitive sensors 24 at an axial location may be arranged on opposite sides and/or orthogonal sides of a rotational component (e.g., shaft 16), thereby improving the accuracy of the monitoring system 12 to determine a position, movement, and/or vibration of the rotational component. Furthermore, the capacitive sensors 24 may be disposed in an external environment 34 or within an internal environment 36, such as within enclosures 38 about the driver 14 and/or the load 18. In some embodiments, the external environment 34 may include a subsea environment at a pressures including, but not limited to, 34.5 MPa, 69 MPa, 103 MPa, or more (e.g., 5,000 psi, 10,000 psi, or 15,000 psi, or more).

Each capacitive sensor 24 transmits feedback (e.g., signals) via signal lines 40 to a controller 42 based at least in part on a voltage between the capacitive sensor 24 and the rotational component, such as the shaft 16. As discussed in detail below, the voltage between the capacitive sensor 24 and the rotational component (e.g., shaft 16) may be proportional to the distance between the capacitive sensor 24 and the rotational component. A processor 44 of the controller 42 determines one or more operational parameters from the received signals of the capacitive sensors 24. The controller 42 may store received signals and/or instructions or code for processing the received signals in a non-transitory machine-readable medium 46, such as memory. The non-transitory machine-readable medium 46 (e.g., memory) does not include transitory signals, and may be volatile memory or non-volatile memory. In some embodiments, the non-transitory machine-readable medium 46 may include, but is not limited to, random access memory (RAM), read-only memory (ROM), flash memory, a hard drive, or any other optical, magnetic, and/or solid-state storage media, or some combination thereof. In some embodiments, the controller 42 may include an industrial controller, a workstation, a laptop, a mobile device, or a tablet.

In some embodiments, the shaft 16 may be arranged within a passage 48 (e.g., bore) of the driver 14, gearbox 30, or load 18, or any combination thereof. The passage 48 may enable a fluid 50 (e.g., gas, liquid) to at least partially fill a space between the shaft 16 and the passage 48. The fluid 50 may be a lubricant (e.g., oil), a coolant (e.g., water, air), or any combination thereof. In some embodiments, the fluid 50 within the passage 48 may be a fluid bearing for the shaft 16. A pump 52 may circulate the fluid 50 to the passage 48 from a reservoir 54. The passage 48 may be aligned along a longitudinal axis 56, substantially parallel (e.g., within less than 1, 2, 3, 4, or 5°) with the shaft axis 20. For example, the shaft axis 20 may be coaxial with the longitudinal axis 56 of the passage 48 during operation of the rotational system 10.

Figure 2:
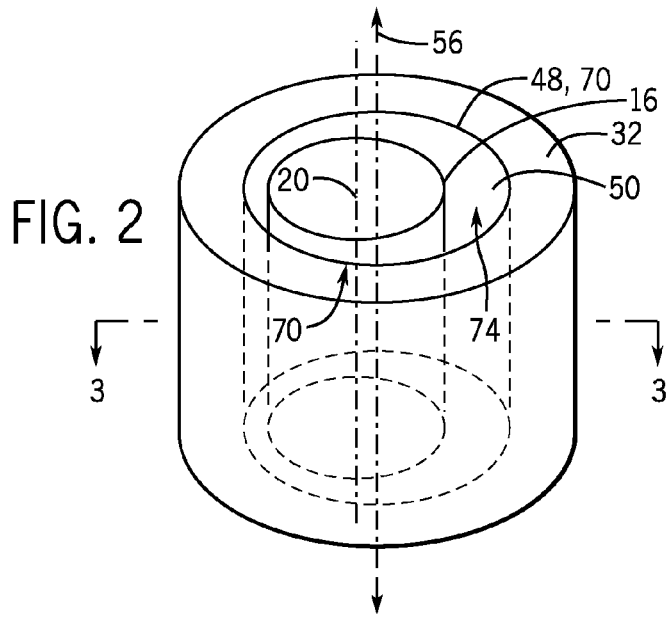
FIG. 2 is a perspective view of an embodiment of a capacitive sensor housing of the monitoring system, in accordance with aspects of the present disclosure.

FIG. 2 illustrates a perspective view of an embodiment of the capacitive sensor housing 32 about the shaft 16. In some embodiments, an inner wall 70 (e.g., inner annular wall) of the sensor housing 32 may be a wall of the passage 48 about the shaft 16. The capacitive sensor housing 32 may be of any shape, such that capacitive sensors 24 disposed within the capacitive sensor housing 32 are arranged about the shaft 16. For example, the capacitive sensor housing 32 may be an annular ring as illustrated in FIG. 2. In embodiments, the capacitive sensor housing 32 may be an open ring (e.g., C-shaped) that only partially surrounds the shaft 16. For example, the capacitive sensor housing 32 may circumferentially surround at least approximately 25, 50, 75, or 90 percent or more of the shaft 16. In other words, the capacitive sensor housing 32 may extend circumferentially around 45, 60, 90, 180, 270, or 360 degrees of the shaft 16. The capacitive sensor housing 32 may be a non-electrically conductive material, including but not limited to, ceramic, plastic, rubber, or any combination thereof.

The passage 48 about the shaft 16 forms a space 74 (e.g., annular space) that may be at least partially filled with the fluid 50, as discussed above. In certain situations, forces on the shaft 16 may move the shaft 16 within the passage 48, such that the shaft axis 16 is askew with the longitudinal axis 56 of the passage 48 and/or the shaft axis 16 is not centered in the passage. For example, gravity may pull the shaft 16 toward a bottom portion of the passage 48 during operation of the rotational system 10 and during down periods of the rotational system 10. Additionally, operation of rotational system 10 may cause the axis 20 of the shaft 16 to change position (e.g., translate) relative to the longitudinal axis 56. For example, vibrations may be induced to the shaft 16 via a component coupled to the shaft 16, and/or the shaft 16 may thermally expand or thermally contract as the operating temperature within rotational system 10 changes. Each capacitive sensor 24 of the monitoring system 12 enables the controller 42 to measure and/or monitor the position (e.g., proximity, clearance), the movement (e.g., radial movement), and/or the amount of vibration (e.g., frequency, amplitude, phase) of the shaft 16 relative to each capacitive sensor 24. For example, the controller 42 may monitor the position, movement, and/or vibration sensed by the capacitive sensors 24 to identify trends in the behavior of the shaft 16. In some embodiments, the controller 42 may identify resonant behavior of the shaft 16 via capacitive sensors 24. As discussed above, each capacitive sensor 24, such as capacitive sensors 24 disposed within the capacitive sensor housing 32, transmit a signal representative of the measured position, movement, and/or the amount of vibration of the shaft to controller 32 for processing, analysis, and/or storage.

Figure 3:
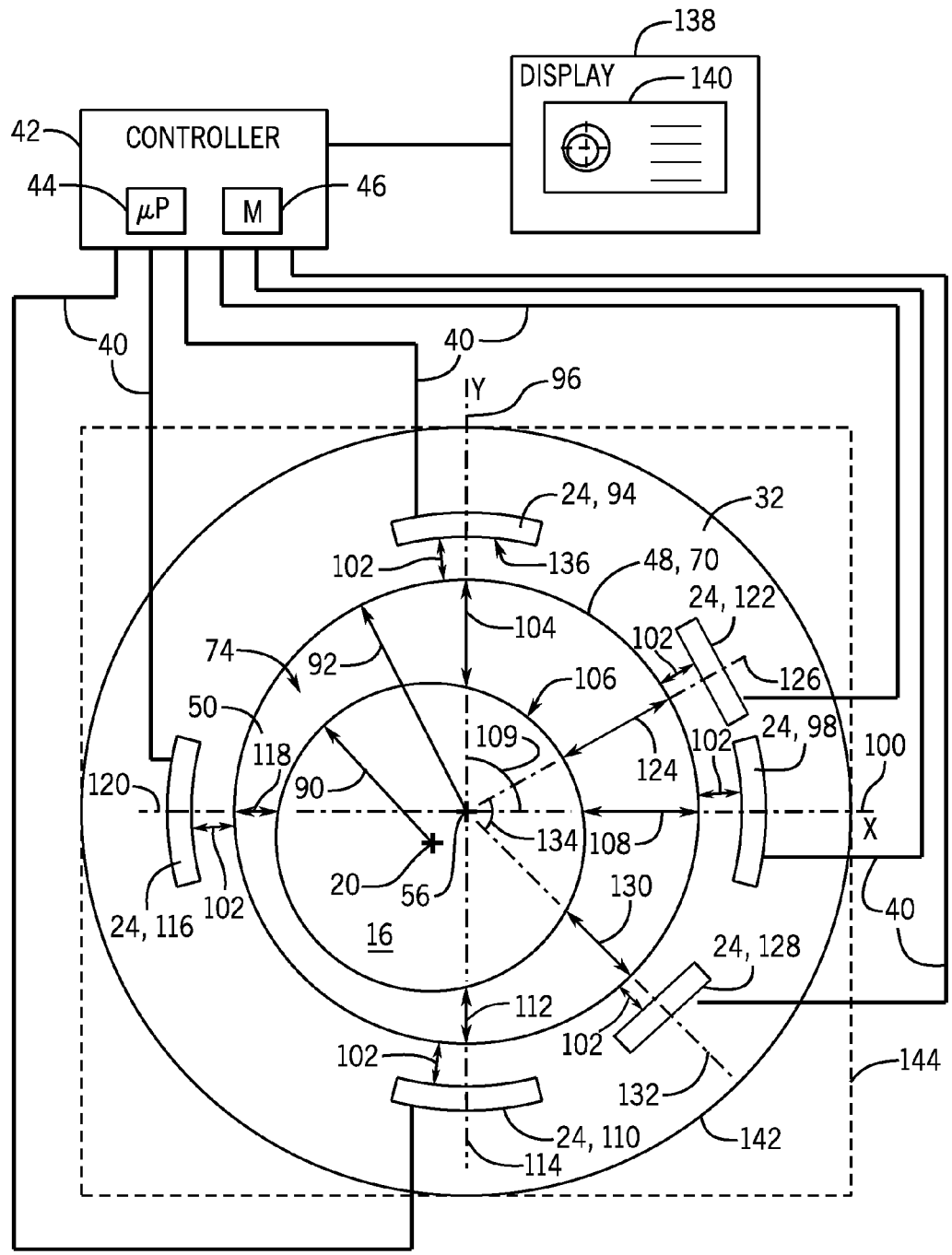
FIG. 3 is a cross-sectional view of an embodiment of a capacitive sensor about a shaft, in accordance with aspects of the present disclosure.

FIG. 3 illustrates a cross-sectional view of the capacitive sensor housing 32 and shaft 16 of FIG. 2, taken along line 3-3. The shaft 16 positioned within the space 74 has a shaft radius 90 from the shaft axis 20, and the passage 48 has a passage radius 92 from the longitudinal axis 56 to the inner wall 70. The capacitive sensors 24 within the capacitive sensor housing 32 are arranged along radial axes relative to the longitudinal axis 56. For example, a first capacitive sensor 94 is arranged along a first radial axis 96 (e.g., Y-axis), and a second capacitive sensor 98 is arranged along a second radial axis 100 (e.g., X-axis). As may be appreciated, FIG. 3 illustrates a planar cross-section of the capacitive sensor housing 32 that is perpendicular to the longitudinal axis 56, such that the first radial axis 96 and the second radial axis 100 are perpendicular to the longitudinal axis 56 through the passage 48.

Each capacitive sensor 24 (e.g., first capacitive sensor 94, second capacitive sensor 98) may be spaced an offset distance 102 from the inner wall 70 (e.g., inner annular wall) of the passage 48. For example, the capacitive sensors 24 may be spaced an offset distance 102 greater then 1, 5, 10, 25, 50, or 100 mm or more from the inner wall 70. In some embodiments, one or more capacitive sensors 24 at an axial location about the shaft 16 may be disposed on the inner wall 70, such that the offset distance 102 is approximately 0 mm. Additionally, or in the alternative, one or more capacitive sensors 24 at an axial location about the shaft 16 may be differently spaced from the inner wall 70, such that the respective offset distance 102 for the first capacitive sensor 94 varies from the respective offset distance 102 for the second capacitive sensor 98. As may be appreciated, an approximately uniform offset distance 102 for each capacitive sensor 24 may simplify the calculations performed by the controller 42, as discussed below.

During operation of the monitoring system 12, each capacitive sensor 24 transmits a signal to the controller 42 based at least in part on a respective voltage between the capacitive sensor 24 and the shaft 16. As may be appreciated, the capacitance of a capacitor may be defined by Equation 1:

$$C=q/V \qquad \text{Equation 1}$$

where C is capacitance (farad), q is the charge (coulomb) on plates of the capacitor, and V is the voltage between the plates. Additionally, the capacitance between two parallel plates may be determined by Equation 2:

$$C=(A*\epsilon)/D \qquad \text{Equation 2}$$

where C is the capacitance of the two plates, A is the area of overlap of the two plates, $\epsilon$ is the electrical permittivity (e.g., dielectric constant) of the materials between the two plates, and D is the distance between the two plates. The controller 42 may execute instructions to determine the capacitance between each capacitive sensor 24 and the shaft 16 utilizing an equation that relates C, A, $\epsilon$, and D. In some embodiments, the controller 42 may approximate C utilizing Equation 2 by considering the capacitive sensor 24 and the shaft 16 as parallel plates. In some embodiments with curved capacitive sensors 24 and the shaft 16, the controller 42 may determine C as defined by Equation 3:

$$C=(2*\pi*\epsilon*L)/(ln(b/a)*s) \qquad \text{Equation 3}$$

where C is the capacitance between the capacitive sensor 24 and the shaft 16, $\epsilon$ is the electrical permittivity of the materials between the capacitive sensor 24 and the shaft 16, L is the axial length of the capacitive sensor 24, b is the sum of the passage radius 92 and the sensor offset distance 102, a is the shaft radius 90, and s is the fraction of the circumference at distance b along which the capacitive sensor 24 extends. Electromagnetic fields near the capacitive sensor 24 may have a reduced effect on the operation of the capacitive sensor 24 relative to other types of sensors, such as eddy current sensors. Accordingly, the capacitance between each capacitive sensor 24 and the shaft 16 may be determined based on geometric properties and material properties of the capacitive sensor 24, the shaft 16, and the materials (e.g., capacitive sensor housing 32, fluid 50) between the capacitive sensor 24 and the shaft 16.

The first capacitive sensor 94 is spaced a first distance 104 and the offset distance 102 along the first radial axis 96 from a face 106 of the shaft 16, and the second capacitive sensor 98 is spaced a second distance 108 and the offset distance 102 along the second radial axis 100 from the face 106 of the shaft 16. According to Equations 1 and 2, the voltage (e.g., $V_1$) sensed by the first capacitive sensor 94 is functionally related to the first distance 104 (e.g., $D_1$) and the offset distance 102. Likewise, the voltage (e.g., $V_2$) sensed by the second capacitive sensor 98 is functionally related to the second distance 108 (e.g., $D_2$) and the offset distance 102. The first capacitive sensor 94 transmits a first signal to the controller 42 based at least in part on the voltage $V_1$, and the second capacitive sensor 98 transmits a second signal to the controller 42 based at least in part on the voltage $V_2$. The controller 42 may execute instructions to determine the first distance 104 (e.g., $D_1$) based at least in part on the first voltage $V_1$, and the controller 42 may execute instructions to determine the second distance 108 (e.g., $D_2$) based at least in part on the second voltage $V_2$. The controller 42 may execute instructions to determine the position of the shaft axis 20 relative to the longitudinal axis 56 based at least in part on the first distance 104 and the second distance 108. In some embodiments, the controller 42 may execute instructions to determine the clearance between the face 106 and the inner wall 70 from the first distance 104 and the second distance 108.

In some embodiments, the controller 42 may execute instructions to determine movement of the shaft 16 relative to the longitudinal axis 56 with Y-axis 96 coordinates based on the first distance 104, and with X-axis 100 coordinates based on the second distance 108. In the illustrated embodiment, an angle 109 between the Y-axis 96 and the X-axis 100 is 90 degrees (e.g., perpendicular), thereby enabling the respective first and second distances 104, 108 to independently describe the position of the shaft axis 20 relative to the longitudinal axis 56.

In some embodiments, a third capacitive sensor 110 is spaced a third distance 112 and the offset distance 102 along a third radial axis 114 from the face 106 of the shaft 16, and a fourth capacitive sensor 116 is spaced a fourth distance 118 and the offset distance 102 along a fourth radial axis 120 from the face 106 of the shaft 16. The third radial axis 114 may be the first radial axis 96 (e.g., Y-axis), and the fourth radial axis 120 may be the second radial axis 100 (e.g., X-axis), such that the third capacitive sensor 110 is opposite (e.g., diametrically opposed to) the first capacitive sensor 94 and the fourth capacitive sensor 116 is opposite (e.g., diametrically opposed to) the second capacitive sensor 98. The voltage (e.g., $V_3$) sensed by the third capacitive sensor 110 is functionally related to the third distance 112 (e.g., $D_3$) and the offset distance 102. Likewise, the voltage (e.g., $V_4$) sensed by the fourth capacitive sensor 116 is functionally related to the fourth distance 118 (e.g., $D_4$) and the offset distance 102. The third capacitive sensor 110 transmits a third signal to the controller 42 based at least in part on the voltage $V_3$, and the fourth capacitive sensor 116 transmits a fourth signal to the controller 42 based at least in part on the voltage $V_4$. The controller 42 may execute instructions to determine the third distance 112 (e.g., $D_3$) based at least in part on the third voltage $V_3$, and the controller 42 may execute instructions to determine the fourth distance 118 (e.g., $D_4$) based at least in part on the fourth voltage $V_4$. The arrangement of the third capacitive sensor 110 opposite to the first capacitive sensor 94 along the Y-axis 96 and the arrangement of the fourth capacitive sensor 116 opposite to the second capacitive sensor 98 along the X-axis 100 may improve the accuracy of the determination by the controller 42 of the position of the shaft axis 20 relative to the longitudinal axis 56. Additionally or in the alternative, the configuration of capacitive sensors 24 on opposite sides of the shaft 16 may simplify the determination of the position of the shaft axis 20 within the passage 48 relative to the determination by proximity sensors in other configurations. For example, when the capacitive sensors 24 are arranged in 1, 2, 3, 4, 5, 6, 7, 8, 9, 10, or more opposing pairs about the shaft 16, the controller 42 may reject common mode noise from the respective distances determined along each radial axis. In some embodiments, the opposing pairs may be circumferentially spaced about the longitudinal axis 56 from one another at increments of 10, 20, 30, 45, 60, 90, or 180 degrees, or any combination thereof. The controller 42 may execute instructions to determine the position of the shaft axis 20 relative to the longitudinal axis 56 based at least in part on the first distance 104, the second distance 108, the third distance 112, and the fourth distance 118.

Additionally, or in the alternative, capacitive sensors 24 may be arranged about the shaft 16 along radial axes other than the Y-axis 96 and the X-axis 100. For example, a fifth capacitive sensor 122 is spaced a fifth distance 124 and the offset distance 102 along a fifth radial axis 126 from the face 106 of the shaft 16, and a sixth capacitive sensor 128 is spaced a sixth distance 130 and the offset distance 102 along a sixth radial axis 132 from the face 106 of the shaft 16. An angle 134 between the fifth radial axis 126 and the sixth radial axis 132 may be greater than or less than 90 degrees. The angle 134 may include, but is not limited to, an angle between 0 to 90 degrees or between 90 to 180 degrees. The controller 42 may execute instructions to determine the fifth distance 124 (e.g., $D_5$) based at least in part on a fifth voltage $V_5$ sensed by the fifth capacitive sensor 122, and the controller 42 may execute instructions to determine the sixth distance 130 (e.g., $D_6$) based at least in part on a sixth voltage $V_6$ sensed by the sixth capacitive sensor 128. The controller 42 may execute instructions to determine coordinates of the shaft axis 20 along the Y-axis 96 and the X-axis 100 utilizing two or more distances along different radial axes. That is, the controller 42 may factor out the Y-axis component of the shaft axis 20 position two distances along different radial axes, and the controller 42 may factor out the X-axis component of the shaft axis 20 position from two or more distances along different radial axes. For example, the controller 42 may execute instructions to determine coordinates of the shaft axis 20 utilizing various combinations of two or more distances along different radial axes, including but not limited to, (A) the first distance 104 and the second distance 108, (B) the first distance 104 and the fifth distance 124, (C) the fifth distance and the sixth distance 130, (D) the first distance 104, the second distance 108, the third distance 112, and the fourth distance 118, or (E) the first distance 104, the second distance 108, the third distance 112, the fourth distance 118, the fifth distance 124, and the sixth distance 130, or any combination thereof.

As discussed above with Equation 2, the capacitance between parallel plates is based at least in part on the electrical permittivity e (e.g., dielectric constant) of the materials between the two plates. The electrical permittivity e of the fluid 50 within the passage 48 between the capacitive sensors 24 and the shaft 16 may affect the sensed voltage by each capacitive sensor 24. During operation of the rotational system 10, the electrical permittivity $\epsilon$ of the fluid 50 may change based at least in part on characteristics of the fluid 50, such as temperature, entrained particles, or any combination thereof. Accordingly, the fluid 50 may have a first electrical permittivity $\epsilon_1$ at startup of the rotational system 10 when the fluid 50 is at a first temperature (e.g., 10° C.), and a second electrical permittivity $\epsilon_2$ during steady-state operation of the rotational system when the fluid 50 is at a second temperature (e.g., 50° C.). In some embodiments, the controller 42 may execute instructions to determine the electrical permittivity of the fluid 50, such as via temperature measurement, direct measurement, computer models, equations, look-up tables, or any combination thereof. Additionally or in the alternative, the controller 42 may execute instructions to factor out the electrical permittivity of the fluid 50 from the determination of the respective distances. For example, the controller 42 may determine the electrical permittivity $\epsilon$ of the fluid 50 from measurements obtained by the first capacitive sensor 94, measurements obtained from the opposing third capacitive sensor 110, and the relationship between $D_1$ and $D_3$ along the Y-axis 96. That is, the controller 42 may solve for the electrical permittivity $\epsilon$ of the fluid 50 utilizing a set of equations and determined relationships. Additionally, or in the alternative, the electrical permittivity of the fluid 50 may be assumed to be approximately homogenous (e.g., within 5 percent or less) within the passage 48 for each of the capacitive sensors 24 at an axial location about the shaft 16. In some embodiments, the controller 42 may determine characteristics of the fluid 50 through comparison of determined values of the electrical permittivity to previously determined electrical permittivity values, computer models, equations, look-up tables, or any combination thereof.

The overlapping area A of each of the capacitive sensors 24 relative to the face 106 of the shaft 16 affects the capacitance, and thereby the sensed voltage, of each capacitive sensor 24. In some embodiments, each of the capacitive sensors 24 has approximately the same area A facing the shaft 16, thereby enabling the controller 42 to determine distance through Equations 1 and 2 with one value for the overlapping area A. Additionally, utilizing capacitive sensors 24 with approximately equal areas A may enable a technician to quickly replace a capacitive sensor 24 with another capacitive sensor 24 without changing the overlapping area A value utilized by the controller 42. In some embodiments, one or more capacitive sensors 24 (e.g., first, second, third, and fourth capacitive sensors 94, 98, 110, 116) may be flexible and/or molded into a curved or arcuate shape, thereby enabling the capacitive sensor 24 to be positioned about the rotational component (e.g., shaft 16), such that various points on an inner face 136 of the capacitive sensor 24 are approximately equidistant from the face 106 of the shaft 16 when centered along the longitudinal axis 56. For example, in some embodiments a capacitive sensor may be shaped into a semi-cylindrical plate, a C-shape, or a curved shape with radius of curvature approximately equal to the radius of curvature of the inner wall 70 of the capacitive sensor housing 32. In some embodiments, the one or more flexible capacitive sensors 24 may be flexible printed circuit boards. Additionally, or in the alternative, the capacitive sensor 24 may be disposed on a curved or arcuate shape. In some embodiments, the capacitive sensor 24 may be a metal (e.g., copper, aluminum, silver) plate that is sufficiently isolated from the shaft 16 and other components to enable the development and measurement of a capacitance. The curved inner face 136 (e.g., first capacitive sensor 94) may enable the controller 42 to determine the respective distance with increased accuracy relative to a non-curved (e.g., flat, planar) capacitive sensor 24 (e.g., fifth and sixth capacitive sensors 122,128).

The controller 42 may execute instructions to determine each distance (e.g., $D_1$, $D_2$, $D_3$, $D_4$, $D_5$, $D_6$) based at least in part on a functional relationship between the voltage sensed by the respective capacitive sensor 24. In some embodiments, the functional relationship may be approximated by Equation 4:

$$D_x = k * V_x \qquad \text{Equation 4}$$

where $D_x$ is the distance between the capacitive sensor 24 and the face 106 of the shaft 16, $V_x$ is the voltage sensed by the capacitive sensor 24, and k is a scaling factor. The scaling factor k may be based at least in part on the overlapping area A, the electrical permittivity $\epsilon$ of the materials between the capacitive sensor 24 and the shaft 16, and the charge stored on the inner face 136 of the capacitive sensor 24. In some embodiments, the controller 42 may execute instructions to utilize the same scaling factor k for each distance determination because of the assumed homogeneity of the fluid 50 and the common overlapping areas A of each capacitive sensor 24. The memory 46 may store various values for the scaling factor k corresponding to different operating conditions of the rotational system 10 (e.g., temperature, dielectric material, gap linearization factor)

As discussed above, the controller 42 may execute instructions to determine the position of the shaft axis 20 relative to the longitudinal axis 56 based at least in part on the voltages received from the capacitive sensors 24. Additionally, or in the alternative, the controller 42 may execute instructions to determine the position of the shaft face 106 relative to the inner wall 70 of the passage 48. The controller 42 may be coupled to a display 138, which may provide an indication 140 (e.g., graphical, numerical) of the position of the shaft axis 20 and/or the shaft face 106 to an operator. The controller 42 may execute instructions to provide an indication to the operator when the shaft face 106 is within a predetermined distance (e.g. 10, 5, or 1 mm or less) of the inner wall 70, thereby enabling the operator to adjust the position of the shaft 16 or to schedule a maintenance session to adjust the clearance of the shaft 16. The controller 42 may execute instructions to sample the position of the shaft axis 20 periodically or substantially continuously during operation of the rotational system 10. The sample rate for the capacitive sensors 24 of the monitoring system 12 during operation of the rotational system 10 may be approximately 1 Hz, 1 kHz, 10 kHz, 100 kHz, or more. In some embodiments, the controller 42 may execute instructions to sample the position of the shaft axis 20 prior to start up of the rotational system 10 to inform the operator of the position of the shaft 16. That is, the controller 42 may execute instructions to sample the position of the shaft axis 20 when the rotational system 10 is at rest (e.g., not rotating).

The controller 42 may execute instructions to store some or all of the sampled positions of the shaft axis 20 in memory 46, thereby generating a history of the position of the shaft axis 20 during operation of the rotational system 10. The controller 42 may execute instructions to review the history to identify patterns, trends, and/or anomalies. For example, the controller 42 may execute instructions to identify loading events (e.g., engagement or disengagement of load, changes in the load) on the shaft 16 via identifying changes to position of the shaft axis 20. Additionally, or in the alternative, the controller 42 may execute instructions to identify vibrations of the shaft through analysis of the history of the position of the shaft axis 20 over a period of time. The history of the position of the shaft axis 20 may be displayed on the display 138. In some embodiments, capacitive sensors 24 may be arranged near a component (e.g., bearing assembly 28, gearbox 30, rotor, turbine stage, compressor stage) along the shaft 16, thereby enabling the controller 42 to determine vibrations of the component.

As discussed above, the capacitive sensor housing 32 at least partially circumferentially surrounds the shaft 16. For example, the capacitive sensor housing 32 may extend circumferentially around 45, 60, 90, 180, 270, or 360 degrees of the shaft 16. In some embodiments, the capacitive sensor housing 32 may be a split ring (i.e., split axially or having a plurality of sections), thereby enabling the capacitive sensor housing 32 to be installed about the shaft 16 and/or passage 48 from a radial direction (e.g., along the Y-axis 96 or X-axis 100). While an outer wall 142 of the capacitive sensor housing 32 illustrated by the solid line of FIG. 3 has a circular or annular form, one may appreciate that the outer wall 142 may have various geometries including, but not limited to, triangular, rectangular 144, pentagonal, hexagonal, octagonal, and so forth. In some embodiments, the capacitive sensors 24 are disposed within the capacitive sensor housing 32 at fixed positions (e.g., along the Y-axis 96 and the X-axis 100), thereby enabling a technician to install the capacitive sensors 24 about the shaft 16 in a known relationship relative to one another. That is, the capacitive sensor housing 32 enables the technician to simultaneously dispose multiple capacitive sensors 24 at defined positions/orientations rather than sequentially disposing multiple capacitive sensors 24 about the shaft 16.

Figure 4:
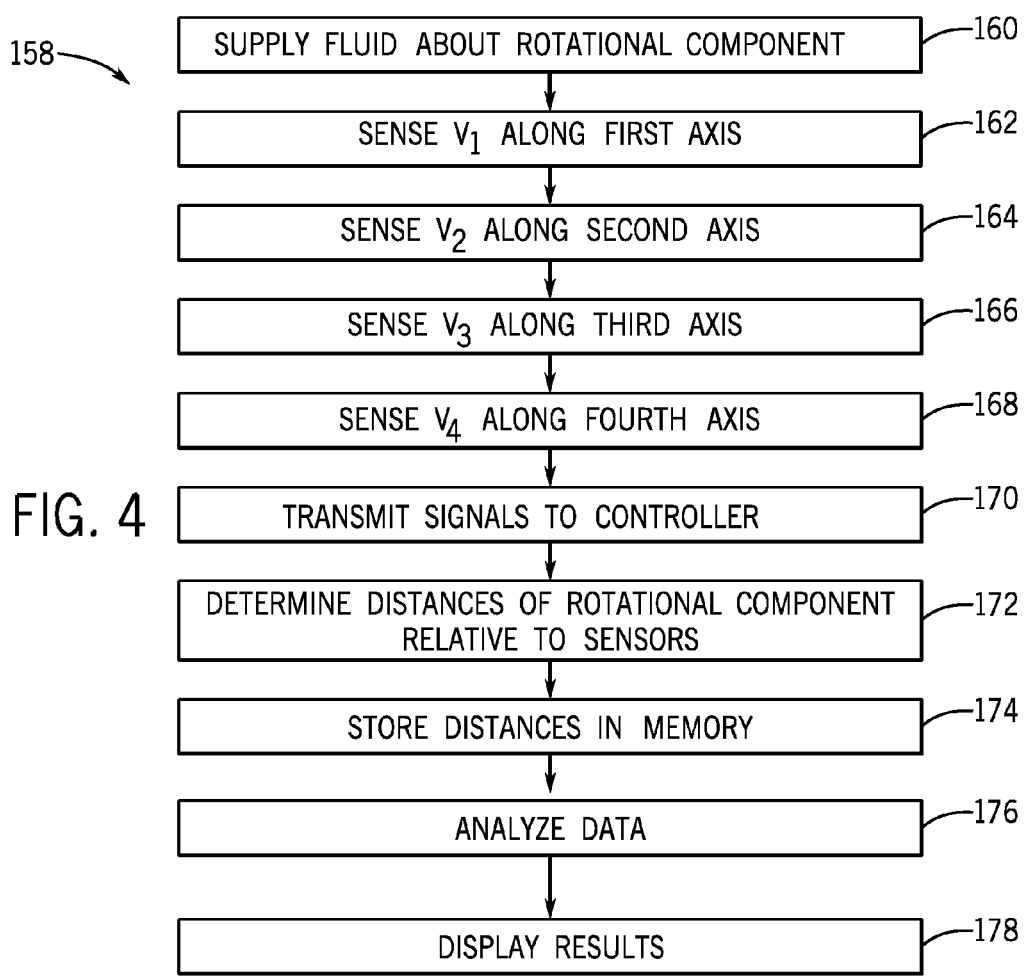
FIG. 4 is a flow chart of an embodiment of a process for determining a parameter of a rotational component, in accordance with aspects of the present disclosure.

FIG. 4 illustrates a flow chart of an embodiment of a computer-implemented method 158 for utilizing the monitoring system 12 described above to determine a parameter of a rotational component of a rotational system 10. In some embodiments, the rotational system 10 may supply (block 160) a fluid about one or more rotational components. For example, the rotational system 10 may supply a fluid (e.g., air, water, oil, coolant, nitrogen, etc.) at least partially about a rotational component for lubrication and/or cooling of the rotational component (e.g., shaft 16). The first capacitive sensor positioned along a first radial axis (e.g. Y-axis 96) at a first axial position senses (block 162) a first voltage $V_1$, and a second capacitive sensor positioned along a second radial axis (e.g., X-axis 100) at the first axial position senses (block 164) a second voltage $V_2$. In some embodiments, the first axial position may be a position about the shaft 16 near a bearing assembly 28, a gearbox 30, or a loading point (e.g., rotor, gear, turbine stage, compressor stage) of the driver 14 or the load 18. The first and second radial axes 96, 100 may form a reference frame that may be utilized to define a position of the rotational component. In some embodiments, the third capacitive sensor positioned along a third radial axis at the first axial position senses (block 166) a third voltage $V_3$. In some embodiments, the fourth capacitive sensor positioned along a fourth radial axis at the first axial position senses (block 168) a fourth voltage $V_4$. As discussed above, the third radial axis may be the first radial axis (e.g., Y-axis) and the fourth radial axis may be the second radial axis (e.g., X-axis), such that the third capacitive sensor is opposite (e.g., diametrically opposed to) the first capacitive sensor and the fourth capacitive sensor is opposite (e.g., diametrically opposed to) the second capacitive sensor. Each of the capacitive sensors of the monitoring system 12 transmits (block 170) a signal to the controller 42 of the monitoring system 12 based at least in part on the sensed voltages. In some embodiments, the signals transmitted to the controller 42 are the sensed voltages. Accordingly, the controller 42 may receive sensed voltages from two, three, four, or more capacitive sensors positioned at an axial location about the rotational component.

The controller 42 executes instructions to determine (block 172) the distances of the rotational component from each of the respective capacitive sensors. In some embodiments, the controller 42 executes instructions to determine the distances based at least in part on a functional relationship between the distance and the sensed voltage. The controller 42 may execute instructions to utilize the arrangement of the capacitive sensors relative to the rotational component, the areas of the capacitive sensors 24, and/or a determined or predefined value for the electrical permittivity of the fluid to simplify the distance determinations. For example, a common area of the capacitive sensor plates may enable the controller 42 to utilize the same value for A in Equation 2. Additionally, or in the alternative, the controller 42 may execute instructions to determine or receive a value for the electrical permittivity of the fluid and utilize a scaling factor to determine the respective distances between the capacitive sensors 24 and the rotational component from the sensed voltages. Whereas measurements of eddy current sensors and other types of proximity sensors may be adversely affected by electromagnetic fields, the voltage sensed by the capacitive sensors 24 may be primarily based on the geometric properties and/or material properties of the capacitive sensors, the rotational component, and the materials between the capacitive sensors and the rotational component. That is, the sensed voltages by the capacitive sensors 24 may be substantially unaffected by electromagnetic fields. Accordingly, the capacitive sensors 24 may be utilized in monitoring systems in environments that may be susceptible to electromagnetic fields during operation, such as near windings of a generator or motor. The controller 42 may execute instructions to determine the position of the rotational component within the reference frame based at least in part on the determined distances. For example, the controller 42 may execute instructions to determine the position of a shaft axis 20 relative to a longitudinal 56 axis, where the first radial axis 96 and the second radial axis 100 are mutually perpendicular through the longitudinal axis 56 as shown in FIG. 3.

In some embodiments, the controller 42 executes instructions to store (block 174) some or all of the determined distances in a memory, generating a history of the distances corresponding to the sample times. Additionally, or in the alternative, the controller 42 may execute instructions to store the position of the rotational component relative to the reference frame (e.g., longitudinal axis 56). The controller 42 and/or the operator may analyze (block 176) the stored data. For example, analysis of the stored distance or position data may identify patterns, trends, loading events, or vibration profiles, or any combination thereof, of the rotational component. The controller 42 may execute instructions to display (block 178) the results of block 172 and/or block 176. That is, the controller 42 may display the determined distances of the rotational component relative to the capacitive sensors, the current position of the rotational component within the reference frame, the movement of the rotational component over a period of time, timings of loading events, a vibration profile, or any combination thereof. While method 158 describes a method of operating a set of two or more capacitive sensors about a rotational component at a first axial position, the controller 42 may be utilized to monitor the same rotational component at a second axial position and/or to monitor another rotational component of the rotational system.

As described above, the monitoring system utilizes two or more capacitive sensors to determine operational parameters of a rotational component. The capacitive sensors may be utilized in environments subject to electromagnetic fields that may disrupt eddy current sensors and other types of proximity sensors. The arrangement and/or quantity of the capacitive sensors disposed about a rotational component may simplify the determination of the distance between the rotational component (e.g., shaft) and the capacitive sensors. The monitoring system may determine and display to an operator the determined operational parameters. The operational parameters may include, but are not limited to, the current position of the rotational component relative to a reference frame, the historical movement of the rotational component, loading events of the rotational component, or a vibration profile of the rotational component, or any combination thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system, comprising:
a first capacitive sensor disposed about a longitudinal axis and along a first axis radial to the longitudinal axis, wherein the first capacitive sensor is configured to transmit a first signal based at least in part on a first position of a face of a rotational component along the first axis relative to the longitudinal axis, wherein the rotational component comprises a shaft;
a second capacitive sensor disposed about the longitudinal axis and along a second axis radial to the longitudinal axis, wherein the second axis is different from the first axis, and the second capacitive sensor is configured to transmit a second signal based at least in part on a second position of the face of the rotational component along the second axis relative to the longitudinal axis;
a third capacitive sensor disposed about the longitudinal axis and along the first axis opposite to the first capacitive sensor, wherein the third capacitive sensor is configured to transmit a third signal based at least in part on a third position of the face of the rotational component along the first axis; and
a fourth capacitive sensor disposed about the longitudinal axis and along the second axis opposite to the second capacitive sensor, wherein the fourth capacitive sensor is configured to transmit a fourth signal based at least in part on a fourth position of the face of the rotational component along the second axis.

2. The system of claim 1, wherein the first axis is perpendicular to the second axis through the rotational component.

3. The system of claim 1, comprising a housing disposed about the first capacitive sensor, the second capacitive sensor, the third capacitive sensor, and the fourth capacitive sensor, wherein the housing is configured to be disposed about the longitudinal axis and the rotational component.

4. The system of claim 3, comprising a bearing assembly configured to support the rotational component, wherein the housing is disposed adjacent to the bearing assembly.

5. The system of claim 4, comprising:
an enclosure configured to isolate an internal environment within the enclosure from an external environment external to the enclosure, wherein the housing and the bearing assembly are disposed within the internal environment of the enclosure; and
machinery coupled to the shaft and disposed within the internal environment of the enclosure, wherein the machinery comprises a motor, a pump, a generator, or any combination thereof.

6. The system of claim 5, wherein the external environment comprises a pressure up to approximately 103 MPa.

7. The system of claim 3, wherein the housing comprises an annular ring.

8. The system of claim 1, wherein at least one of the first capacitive sensor, the second capacitive sensor, the third capacitive sensor, and the fourth capacitive sensor is disposed on a flexible circuit board.

9. The system of claim 1, wherein a first face of the first capacitive sensor, a second face of the second capacitive sensor, a third face of the third capacitive sensor, and a fourth face of the fourth capacitive sensor are curved at least partially about the longitudinal axis.

10. The system of claim 1, comprising a controller configured to determine a parameter of the system based at least in part on the first signal, the second signal, the third signal, and the fourth signal, wherein the parameter comprises a location of the rotational component relative to the longitudinal axis, a vibration of the rotational component about the longitudinal axis, a characteristic of a fluid disposed about the rotational component, or any combination thereof.

11. The system of claim 10, comprising a housing disposed about the first capacitive sensor, the second capacitive sensor, the third capacitive sensor, the fourth capacitive sensor, and the controller, wherein the housing is configured to be disposed about the longitudinal axis and the rotational component.

12. A system comprising:
a shaft comprising a shaft axis, wherein the shaft is configured to rotate about a longitudinal axis; and
a first sensor assembly disposed about the longitudinal axis at a first axial position, the first sensor assembly comprising:
a first capacitive sensor comprising a first face disposed a first distance from a shaft face of the shaft along a first axis, wherein the first capacitive sensor is configured to transmit a first signal based at least in part on the first distance;
a second capacitive sensor comprising a second face disposed a second distance from the shaft face of the shaft along a second axis that is perpendicular to the first axis, wherein the second capacitive sensor is configured to transmit a second signal based at least in part on the second distance;
a third capacitive sensor comprising a third face disposed a third distance from the shaft face of the shaft along the first axis opposite the first capacitive sensor, wherein the third capacitive sensor is configured to transmit a third signal based at least in part on the third distance;
a fourth capacitive sensor comprising a fourth face disposed a fourth distance from the shaft face of the shaft along the second axis opposite the second capacitive sensor, wherein the fourth capacitive sensor is configured to transmit a fourth signal based at least in part on the fourth distance; and
a controller configured to determine a first parameter of the system at the first axial position based at least in part on the first signal, the second signal, the third signal, and the fourth signal, wherein the first parameter comprises a first location of the shaft relative to the longitudinal axis at the first axial position, a first vibration of the shaft about the longitudinal axis, or any combination thereof.

13. The system of claim 12, comprising a bearing assembly configured to support the shaft, wherein the first sensor assembly is disposed adjacent to the bearing assembly.

14. The system of claim 12, wherein the first sensor assembly comprises a housing, wherein the first capacitive sensor, the second capacitive sensor, the third capacitive sensor, and the fourth capacitive sensor are disposed within the housing.

15. The system of claim 14, comprising a fluid configured to flow between the housing and the shaft, wherein the first parameter comprises a characteristic of the fluid.

16. The system of claim 12, comprising:
a second sensor assembly disposed about the longitudinal axis at a second axial position, the second sensor assembly comprising:
a fifth capacitive sensor comprising a fifth face disposed a fifth distance from the shaft face of the shaft along a third axis, wherein the fifth capacitive sensor is configured to transmit a fifth signal based at least in part on the fifth distance;
a sixth capacitive sensor comprising a sixth face disposed a sixth distance from the shaft face of the shaft along a fourth axis that is perpendicular to the third axis, wherein the sixth capacitive sensor is configured to transmit a sixth signal based at least in part on the sixth distance;
a seventh capacitive sensor comprising a seventh face disposed a seventh distance from the shaft face of the shaft along the third axis opposite the fifth capacitive sensor, wherein the seventh capacitive sensor is configured to transmit a seventh signal based at least in part on the seventh distance; and
an eighth capacitive sensor comprising an eighth face disposed an eighth distance from the shaft face of the shaft along the fourth axis opposite the sixth capacitive sensor, wherein the eighth capacitive senor is configured to transmit an eighth signal based at least in part on the eighth distance;
wherein the controller is configured to determine a second parameter of the system at the second axial position based at least in part on the fifth signal, the sixth signal, the seventh signal, and the eighth signal, wherein the second parameter comprises a second location of the shaft relative to the longitudinal axis at the second axial position, a second vibration of the shaft about the longitudinal axis, or any combination thereof.

17. A method comprising:
transmitting a first signal from a first capacitive sensor to a controller based at least in part on a first distance between the first capacitive sensor and a rotational component, wherein the first capacitive sensor is disposed along a first axis radial to a longitudinal axis;
transmitting a second signal from a second capacitive sensor to the controller based at least in part on a second distance between the second capacitive sensor and the rotational component, wherein the second capacitive sensor is disposed along a second axis radial to the longitudinal axis, and the first axis is perpendicular to the second axis;
transmitting a third signal from a third capacitive sensor to the controller based at least in part on a third distance between the third capacitive sensor and the rotational component, wherein the third capacitive sensor is disposed along the first axis opposite the first capacitive sensor;
transmitting a fourth signal from a fourth capacitive sensor to the controller based at least in part on a fourth distance between the fourth capacitive sensor and the rotational component, wherein the fourth capacitive sensor is disposed along the second axis opposite the second capacitive sensor;
determining a parameter of a rotational system comprising the rotational component based at least in part on the first signal, the second signal, the third signal, and the fourth signal, wherein the parameter comprises a first location of the rotational component relative to the longitudinal axis, a first vibration of the rotational component about the longitudinal axis, a characteristic of a fluid disposed about the rotational component, or any combination thereof; and supplying a fluid between the rotational component and the first capacitive sensor, the second capacitive sensor, the third capacitive sensor, and the fourth capacitive sensor, wherein the fluid comprises a lubricant, a coolant, or any combination thereof.

18. The method of claim 17, comprising:
determining the parameter of the rotational system comprises factoring out a permittivity of the fluid from a first functional relationship between the first distance and the first signal, a second functional relationship between the second distance and the second signal, a third functional relationship between the third distance and the third signal, and a fourth functional relationship between the fourth distance and the fourth signal.

19. The method of claim 17, wherein the rotational component comprises a shaft at least partially disposed within an enclosure.

20. The method of claim 17, wherein determining the parameter of the rotational component comprises rejecting common mode noise of the first signal and the third signal, and rejecting common mode noise of the second signal and the fourth signal.

* * * * *